June 20, 1961 A. S. KHOURI 2,989,665

ELECTRONIC CIRCUITS

Filed Aug. 25, 1958

INVENTOR.
ALFRED S. KHOURI

BY John W. Michael

ATTORNEY

United States Patent Office 2,989,665

Patented June 20, 1961

2,989,665

ELECTRONIC CIRCUITS

Alfred S. Khouri, Milwaukee, Wis., assignor to Globe-Union Inc., Milwaukee, Wis., a corporation of Delaware Filed Aug. 25, 1958, Ser. No. 756,840
2 Claims. (Cl. 317—101)

This invention relates to improvements in electronic circuits or coupling networks and more particularly to the capacitors of said circuits or networks.

Such circuits or networks comprise a base of ceramic material having a high dielectric constant on which are mounted the various elements which make up the circuit. The circuit capacitors are formed by bonding conductive areas to one or both surfaces of the base to which suitable leads are soldered. Due to the type of construction employed and the size and space requirements of such circuits, the maximum capacitance of such ceramic type capacitors is relatively small running in the neighborhood of about .01 mfd.

It is the object of this invention, therefore, to increase the capacitance of one or more of the capacitors of such circuits without unduly increasing the size of the unit or the cost thereof.

Broadly stated, this object is attained by mounting a wound or other similar type capacitor of relatively high capacitance directly on the base of an electronic circuit of the type described above and connecting said capacitor in parallel with one of the ceramic type capacitors of the circuit.

Other objects and advantages will be pointed out in, or be apparent from the specification and claims, as will obvious modifications of the single embodiment shown in the drawings, in which:

Figure 5:
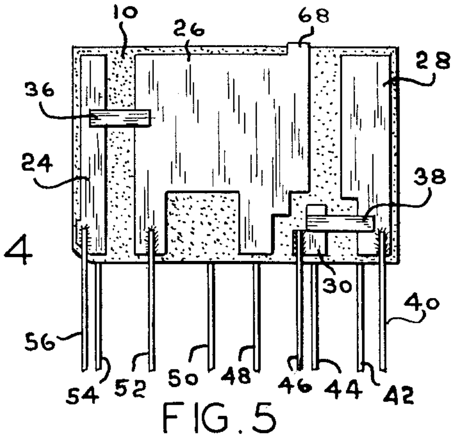
FIG. 5 is a view similar to FIG. 2 but showing the opposite face of the circuit.
Figure 6:
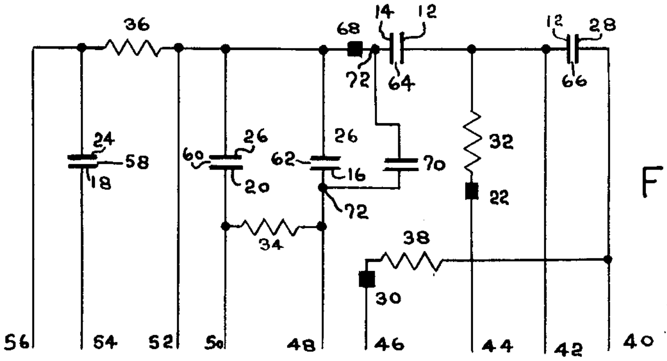
FIG. 6 is a schematic diagram of the electronic circuit of FIGS. 1–5.

Referring to the drawings by reference numerals, the particular electronic circuit viewed in FIGS. 1–5 and shown schematically in FIG. 6 is a coupling network which is used to couple the triode-type detector stage to the audio output stage in the audio section of A.C.-D.C. receivers, TV sets, etc.

The unit includes a base plate 10 made of ceramic material having a high dielectric-constant of about 3,000. The base plate is small. For the embodiment shown the base plate is approximately one inch long, three-quarters inch wide and one-thirty-second inch thick. The length and width of the base will, of course, vary somewhat depending on the particular circuit involved.

Figure 1:
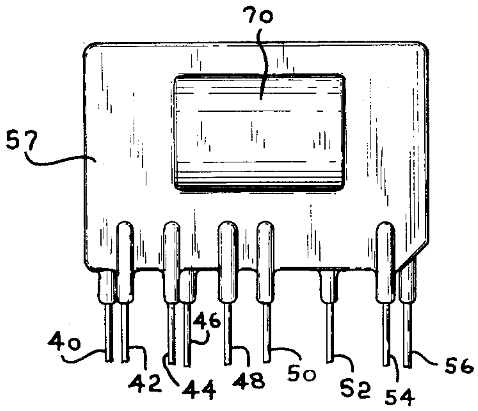
FIG. 1 is a top plan view of an electronic circuit embodying the present invention with a coating of protective material applied thereto.
Figure 2:
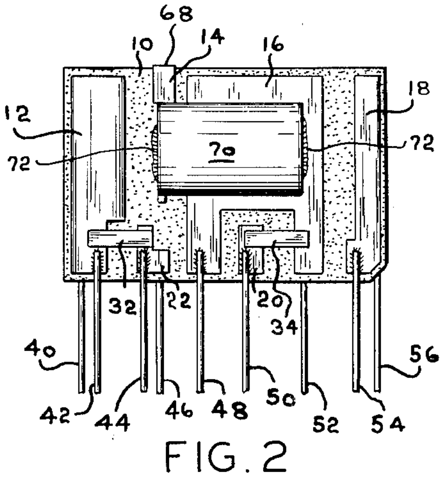
FIG. 2 is a view of the circuit shown in FIG. 1 before the coating of protective material is applied.
Figure 3:
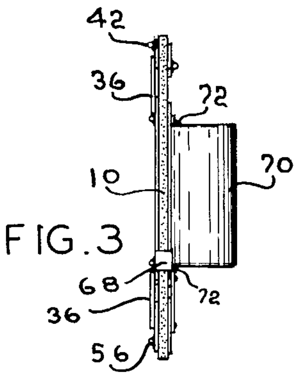
FIGS. 3 and 4 are end and side views, respectively, of the circuit shown in FIG. 2.
Figure 4:
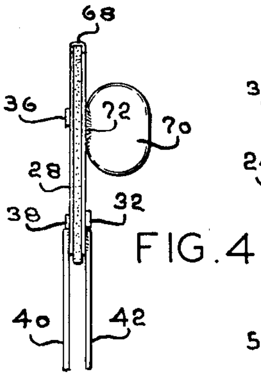

As shown in FIG. 2, conductive areas 12, 14, 16, 18, 20 and 22 are applied to one surface of base plate 10 and, as shown in FIG. 5, conductive areas 24, 26, 28 and 30 are applied to the other surface of the base plate. These conductive areas may be applied by the stencilled screen process by which conductive material containing silver is applied to the ceramic and is then fired to bond the conductive material to the base plate.

A plurality of resistors 32, 34, 36 and 38 are applied as shown in FIGS. 2 and 5. Resistor 32 is applied between conductive areas 12 and 22, resistor 34 between areas 16 and 20, resistor 36 between areas 24 and 26, and resistor 38 between areas 28 and 30. These resistors may be applied in the form of paint containing carbon which is screened on to the surface of the base plate and the conductive areas as shown. Wires are then soldered on to the conductive areas in a well-known manner to form leads 40, 42, 44, 46, 48, 50, 52, 54 and 56.

Referring now to the schematic diagram shown in FIG. 6, the circuit includes a ceramic type capacitor 58 having plates formed by conductive areas 18 and 24 adhered to opposite sides of base plate 10 and having leads 54 and 56, respectively, soldered thereto. Conductive area 26 with a lead 52 soldered thereto and conductive area 20 with a lead 50 soldered thereto form the plates of another parallel plate ceramic type capacitor 60.

Conductive areas 14 and 12 adhered to the same side of the base plate (FIG. 2) form the plates of a ceramic type capacitor 64. Electrical connection to capacitor 64 is established by a lead 42 soldered to conductive area 12 and a lead 52 soldered to conductive area 26 which, in turn, is electrically connected to conductive area 14 by a conductive area 68 adhered to the edge of the base plate as shown. Since conductive areas 14 and 12 are both on the same side of the base plate, the resultant capacitance developed thereby is due to the so-called "edge effect" wherein the electrostatic lines of force extend through the ceramic base plate between the inner or base plate sides of capacitor plates 14 and 12 even though such sides are not opposite each other.

Another ceramic type capacitor 66 is formed by conductive areas 28 and 12 adhered to opposite sides of the base plate and having a lead 40 soldered to area 28 and a lead 42 soldered to area 12. It is noted here that conductive area 12 forms one of the plates of both capacitors 64 and 66.

A fourth ceramic type capacitor 62 is formed by conductive areas 26 and 16 adhered to opposite sides of base plate 10. A wire lead 48 is soldered to area 16 and a wire lead 52 is soldered to plate 26 to complete the capacitor. Here again it is noted that plate 26 forms one of the plates of capactor 60 as well as capacitor 62.

In the disclosed embodiment, capacitor 62 by itself will develop a capacitance of approximately .01 mfd. which is about the maximum for a ceramic type capacitor of an electronic circuit of the general size contemplated in this invention. However, for many electronic circuit applications such as that of the particular embodiment disclosed, a considerably larger capacitance must be developed by one or more of the capacitors in the circuit. To produce the increased capacitance required without unduly increasing the size and cost of the unit, I mount an additional capacitance capacitor 70 of relatively high capacitance directly on the base plate between conductive areas 14 and 16 by means of conductive cement 72 or any other suitable means. Capacitor 70 is thereby connected in parallel with ceramic type capacitor 62 (FIG. 6) since conductive area 14 is connected to plate 26 of capacitor 62 by conductive area 68 on the edge of the base plate. The unit thus constructed may be coated with a protective layer 57 preventing damage due to handling and moisture.

The total capacitance of the parallel connected capacitors 62 and 70 is the sum of the individual capacitance of each. Therefore, to increase the capacitance of the single ceramic type capacitor 62 a substantial amount, capacitor 70 must be a type which will develop a relatively high capacitance with respect to that developed by capacitor 62. I have found that wound type capacitors made from paper foil, metallized paper and other plastics as well as stacked ceramic, mica, and electrolytic types are suitable for this purpose. In the particular embodiment shown and described, a wound type capacitor having a capacitance of approximately .05 mfd. is used to produce a total combined capacitance of about .06 mfd.

While in the particular embodiment shown and described herein, the wound type capacitor is shown connected in parallel with ceramic type capacitor 62 formed by plates (26 and 16) adhered to opposite sides of the base, it should be understood that a wound type capacitor could also be connected in parallel with a ceramic type capacitor formed by a pair of conductive areas adhered to the same side of the base plate. The disclosed embodiment does actually show such an arrangement in that there will be some "edge effect" capacitance developed between conductive areas 14 and 16, both of which are mounted on the same side of the base.

Although but one embodiment of the present invention has been illustrated and described, it will be apparent to those skilled in the art that various changes and modifications may be made therein without departing from the spirit of the invention or from the scope of the appended claims.

I claim:

1. An electronic circuit comprising, a base of ceramic material having a high dielectric constant, first and second film-like conductive areas bonded to opposite sides of said base to form the plates of a ceramic-type capacitor, a wound-type capacitor mounted on said base on top of said first film-like conductive area with its axis parallel to said base, one plate of said wound-type capacitor connected directly to said first conductive area, and means on said base for electrically connecting the other plate of said wound-type capacitor to said second conductive area whereby said ceramic-type capacitor and said wound-type capacitor are electrically connected together in parallel.

2. An electronic circuit comprising, a base of ceramic material having a high dielectric constant, first and second film-like conductive areas bonded to opposite sides of said base to form the plates of a ceramic-type capacitor, a conductive strip bonded to said base and extending from said second conductive area on said base around an edge of said base and onto the other side of said base on which said first conductive area is bonded, a wound-type capacitor mounted on said base on top of said first conductive area and on top of a portion of said conductive strip with its axis paralell to said base, one plate of said wound-type capacitor connected directly to said first conductive area and the other plate of said wound-type capacitor connected directly to said portion of said conductive strip which it overlies.

References Cited in the file of this patent

UNITED STATES PATENTS

| | | |
|---|---|---|
| 2,474,988 | Sargrove | July 5, 1949 |
| 2,607,821 | Van Arsdell | Aug. 19, 1952 |
| 2,759,098 | White | Aug. 14, 1956 |
| 2,769,119 | Martin | Oct. 30, 1956 |
| 2,877,388 | Reid | Mar. 10, 1959 |
| 2,877,389 | Wiener | Mar. 10, 1959 |